United States Patent [19]

Russell

[11] Patent Number: 5,465,238
[45] Date of Patent: Nov. 7, 1995

[54] OPTICAL RANDOM ACCESS MEMORY HAVING MULTIPLE STATE DATA SPOTS FOR EXTENDED STORAGE CAPACITY

[75] Inventor: James T. Russell, Bellevue, Wash.

[73] Assignee: Information Optics Corporation, Issaquah, Wash.

[21] Appl. No.: 273,002

[22] Filed: Jul. 7, 1994

Related U.S. Application Data

[63] Continuation-in-part of Ser. No. 815,924, Dec. 30, 1991, Pat. No. 5,379,266.

[51] Int. Cl.⁶ .................................................. G11C 11/42
[52] U.S. Cl. ........................ 365/234; 365/235; 365/120; 365/124; 369/285; 369/284; 369/116; 359/20
[58] Field of Search ......................... 359/20; 250/208.2; 365/234, 235, 120, 124; 369/285, 116, 100

[56] References Cited

U.S. PATENT DOCUMENTS

| | | |
|---|---|---|
| 3,191,157 | 6/1965 | Parker et al. . |
| 3,573,433 | 4/1971 | Harris . |
| 3,600,054 | 8/1971 | Gabor ........................................ 359/20 |
| 3,637,307 | 1/1972 | Spitz . |
| 3,656,120 | 4/1972 | Maure . |
| 3,676,864 | 7/1972 | Maure et al. . |
| 3,704,068 | 11/1972 | Waly . |
| 3,765,749 | 10/1973 | LaMacchia . |
| 3,806,643 | 4/1974 | Russell . |
| 3,860,917 | 1/1975 | Auria . |
| 3,885,094 | 5/1975 | Russell . |
| 3,898,005 | 8/1975 | Roberts . |
| 3,899,778 | 8/1975 | Roberts . |
| 3,952,290 | 4/1976 | Williams . |
| 3,996,570 | 12/1976 | Roberts . |
| 4,021,606 | 5/1977 | Takeda et al. . |
| 4,227,212 | 10/1980 | Woolfson et al. . |
| 4,663,738 | 5/1987 | Sprague ................................... 365/234 |
| 4,682,861 | 7/1987 | Hosoya . |
| 4,710,911 | 12/1987 | Yamada et al. ......................... 369/100 |
| 4,727,533 | 2/1988 | Erbert . |
| 4,743,091 | 5/1988 | Gelbart . |
| 4,745,417 | 5/1988 | Inokuchi . |
| 4,794,245 | 12/1988 | Auer . |
| 4,899,224 | 2/1990 | Ooba et al. . |
| 4,988,153 | 1/1991 | Pack . |
| 5,007,690 | 4/1991 | Chern et al. . |
| 5,013,107 | 5/1991 | Biles . |
| 5,084,857 | 1/1992 | Miyauchi et al. ....................... 369/116 |
| 5,138,604 | 8/1992 | Umeda et al. . |
| 5,187,360 | 2/1993 | Pasco ...................................... 250/208.2 |

FOREIGN PATENT DOCUMENTS

| | | |
|---|---|---|
| 58-166546 | 10/1983 | Japan . |
| 1188220 | 12/1968 | United Kingdom . |

Primary Examiner—Viet Q. Nguyen
Attorney, Agent, or Firm—Graybeal Jackson Haley & Johnson

[57] ABSTRACT

An optical memory is disclosed in which data is stored in an optical data layer capable of selectively altering light such as by changeable transmissivity or polarization. The data is illuminated by controllable light sources and an array of multi-surface imaging lenslets project the image onto a common array of light sensors. Data is organized into a plurality of regions or patches (called pages) in which each page contains a field of data spots that encode multiple states or levels of data by the amount of transmissivity or polarization of that spot. By selective illumination of each data page, one of the lenslets images the selected data page onto the light sensors. Light in the data image pattern strikes different ones of the arrayed light sensors, thereby outputting the multiple levels per spot in the form of electrical data signals that are A/D converted to digital. A special sensor array uses charge coupled devices (CCDs) that provide multiple storage buckets or levels for each photo sensor element to store and output reference level data along with signal data to quantify and normalize the sensor elements. By selectively and sequentially illuminating different ones of the data regions (pages) on the data layer, correspondingly different data spot patterns are imaged by the corresponding lenslets onto the common sensor array, thereby enabling many stored data pages to be retrieved by multiplexing at electro-optical speed.

20 Claims, 10 Drawing Sheets

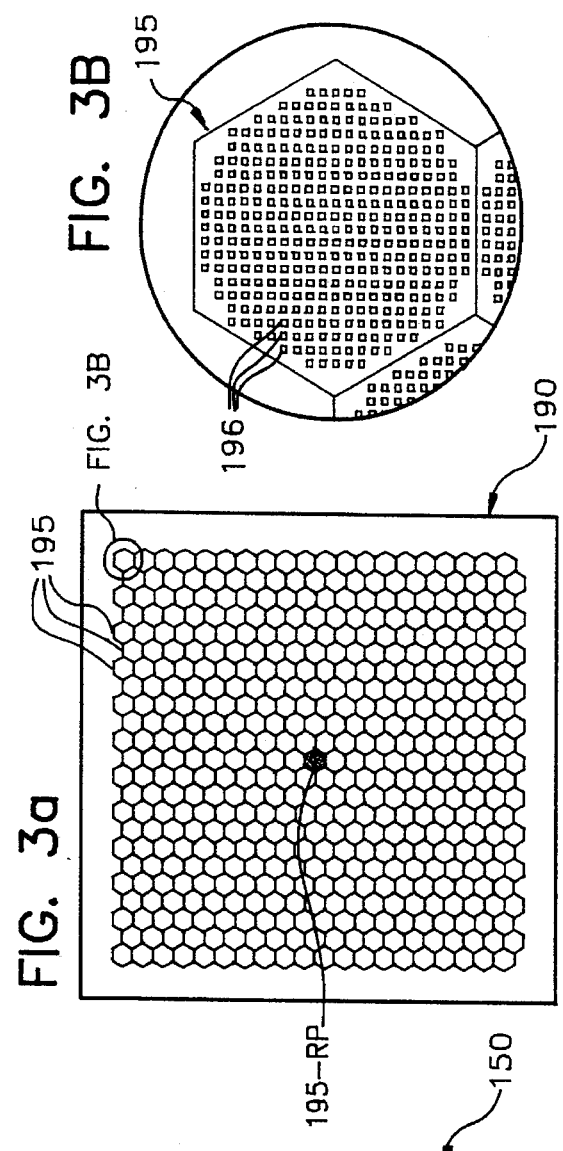
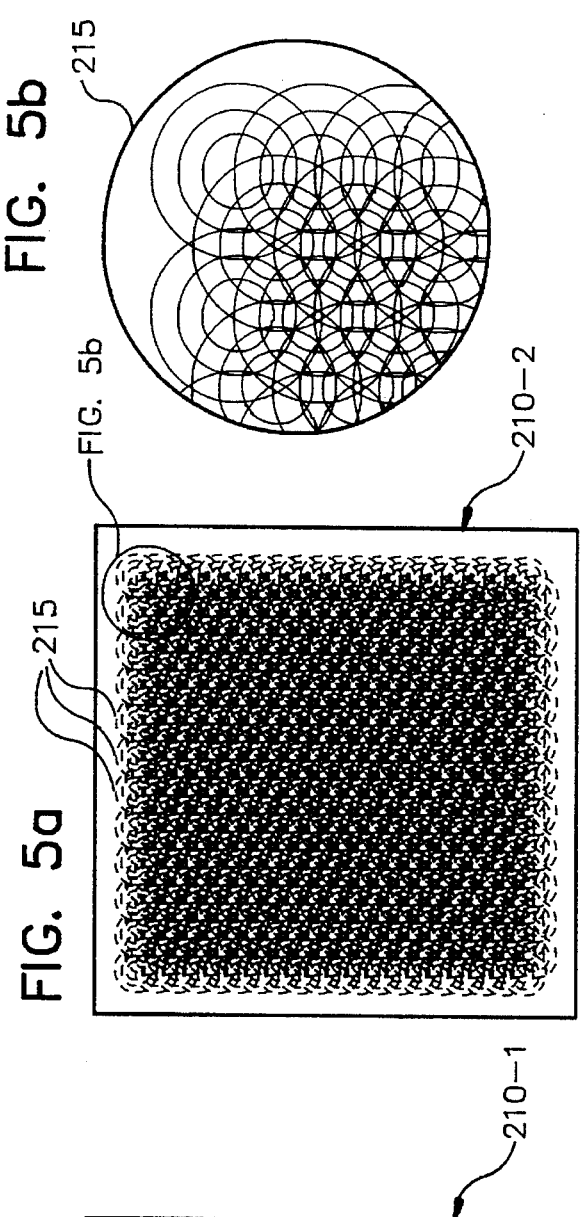
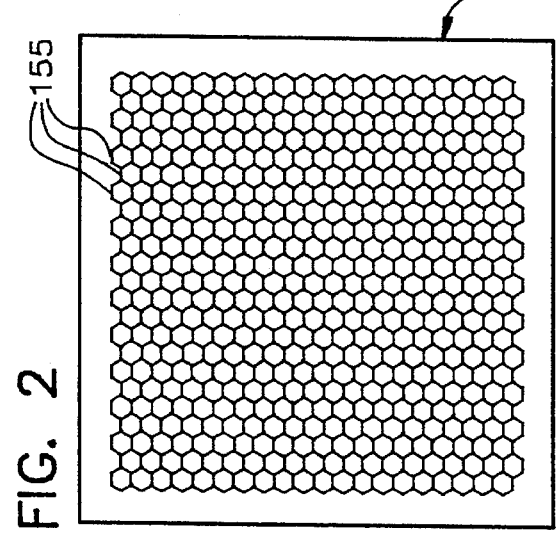
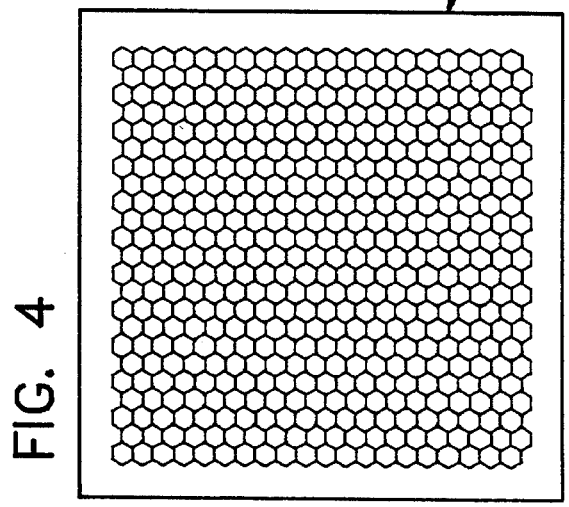

FIG. 8
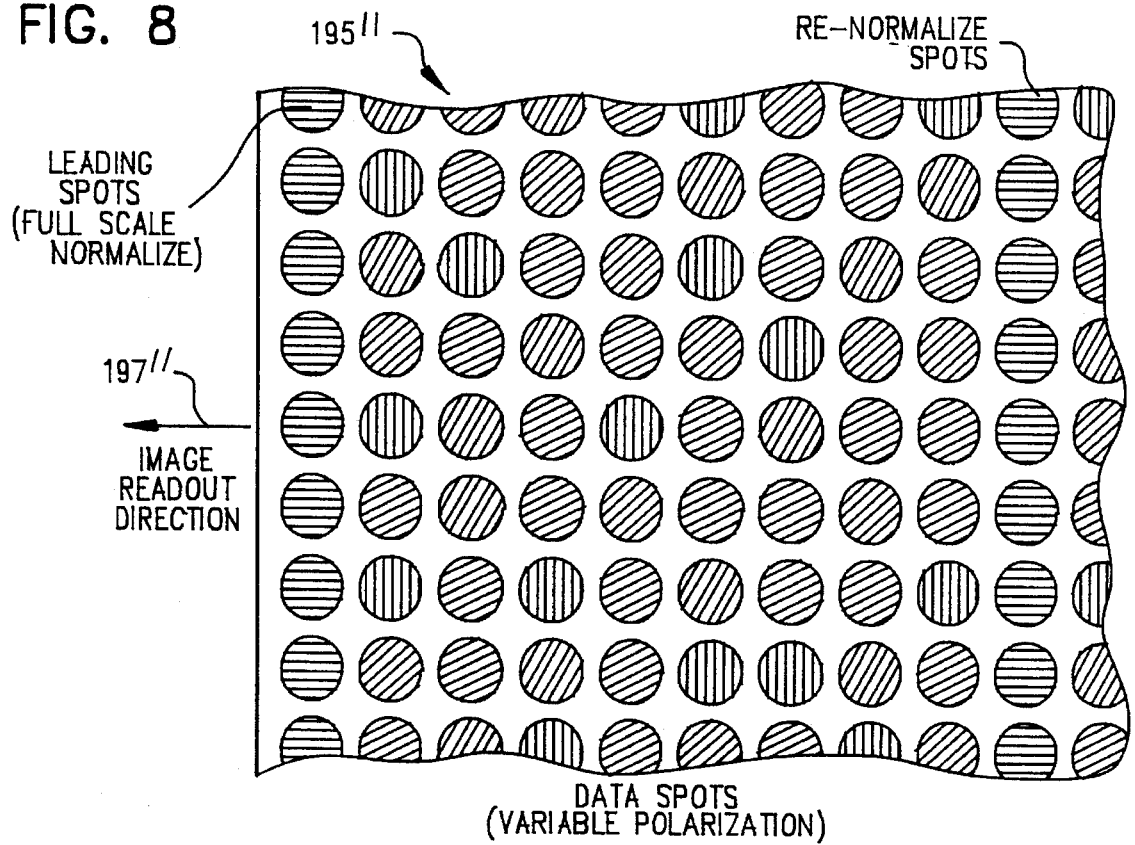
FIG. 9d OVER LAYERS
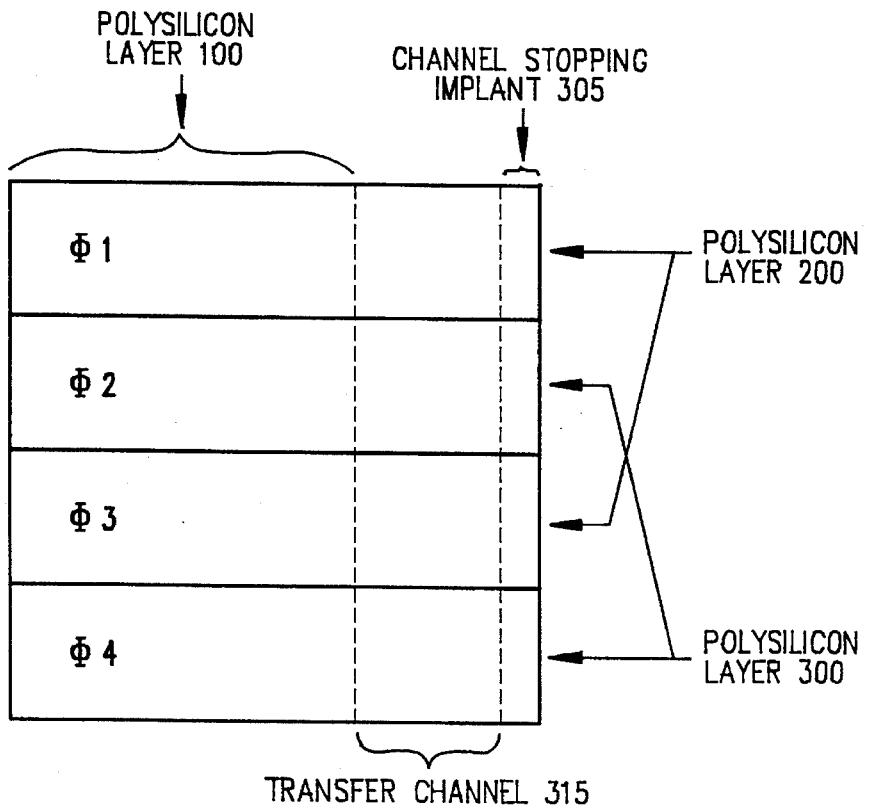

FIG. 9b
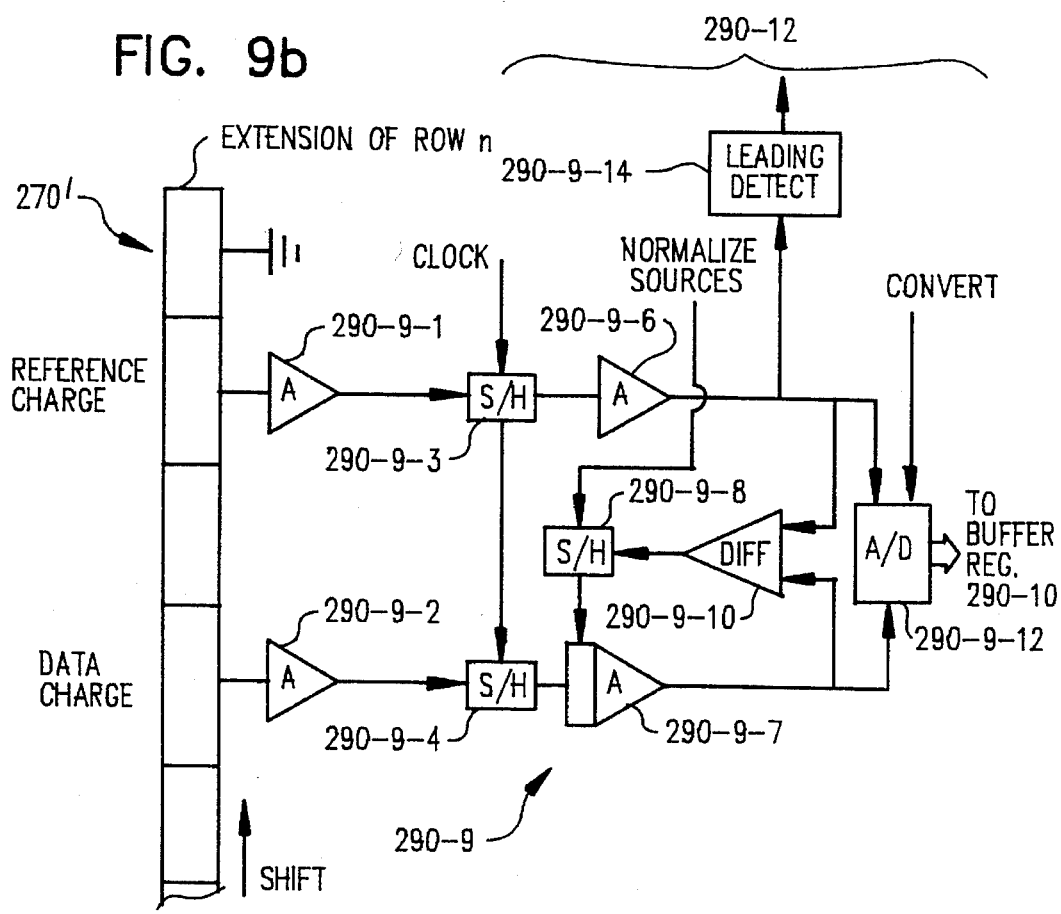
FIG. 9e UNDER LAYERS
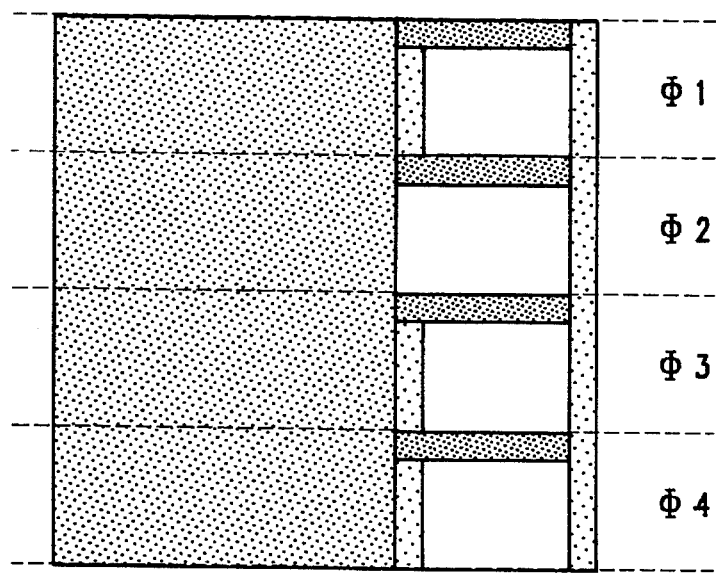

FIG. 9f    ARRAY OF PIXELS
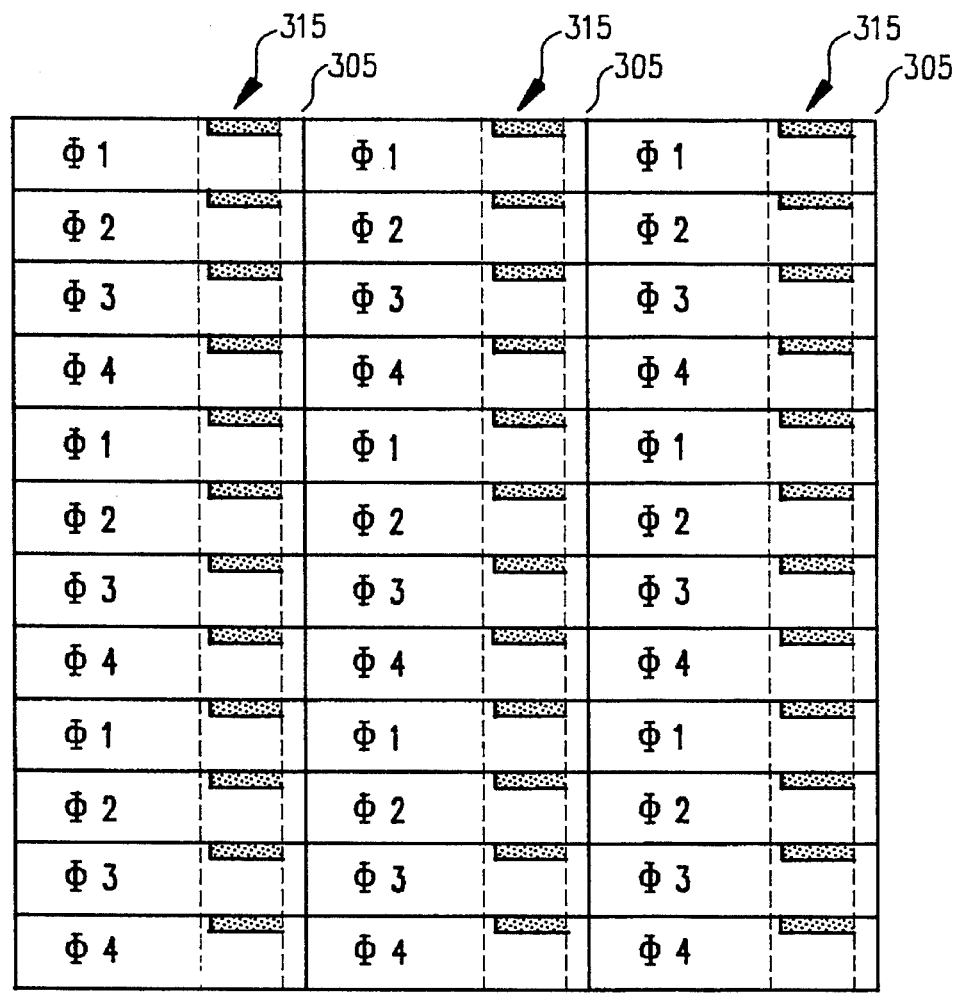
FIG. 9g    TIMING DIAGRAM
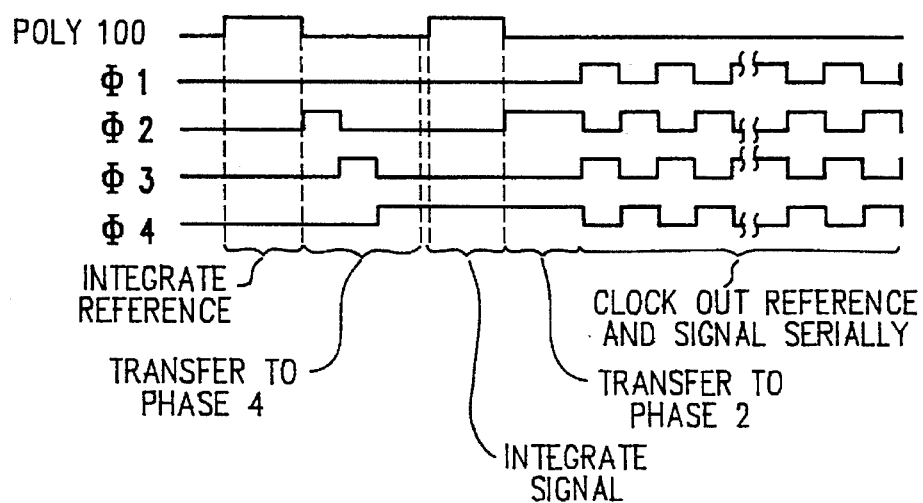

$c_1 = \lambda_1$
$c_2 = \lambda_2$

OPTICAL RANDOM ACCESS MEMORY HAVING MULTIPLE STATE DATA SPOTS FOR EXTENDED STORAGE CAPACITY

CROSS REFERENCE TO RELATED APPLICATIONS

This is a continuation-in-part of U.S. patent application Ser. No. 07/815,924, filed Dec. 30, 1991, now patented U.S. Pat. No. 5,379,266 on 1/3/95, and international Patent Application Serial No. PCT/US92/11356, filed Dec. 30, 1992, by James T. Russell for OPTICAL RANDOM ACCESS MEMORY.

BACKGROUND OF THE INVENTION

The invention concerns method and apparatus of optically storing and retrieving mass digital data stored as light altering characteristics on an optical material and providing fast random access retrieval.

Optical memories of the type having large amounts of digital data stored by light modifying characteristics of a film or thin layer of material and accessed by optical addressing without mechanical movement have been proposed but have not resulted in wide spread commercial application. The interest in such optical recording and retrieval technology is due to its projected capability of faster retrieval of large amounts of data compared to that of existing electro-optical mechanisms such as optical discs, and magnetic storage such as tape and magnetic disc, all of which require relative motion of the storage medium.

For example, in the case of optical disc memories, it is necessary to spin the record and move a read head radially to retrieve the data, which is output in serial fashion. The serial accessing of data generally requires transfer to a buffer or solid state random access memory of a data processor in order to accommodate high speed data addressing and other data operations of modern computers. Other storage devices such as solid state ROM and RAM can provide the relatively high access speeds that are sought, but the cost, size, and heat dissipation of such devices when expanded to relatively large data capacities limit their applications.

Examples of efforts to provide the relatively large capacity storage and fast access of an optical memory of the type that is the subject of this invention are disclosed in the patent literature such as U.S. Pat. No. 3,806,643 for PHOTOGRAPHIC RECORDS OF DIGITAL INFORMATION AND PLAYBACK SYSTEMS INCLUDING OPTICAL SCANNERS and U.S. Pat. No. 3,885,094 for OPTICAL SCANNER, both by James T. Russell; U.S. Pat. No. 3,898,005 for a HIGH DENSITY OPTICAL MEMORY MEANS EMPLOYING A MULTIPLE LENS ARRAY; U.S. Pat. No. 3,996,570 for OPTICAL MASS MEMORY; U.S. Pat. No. 3,656,120 for READ-ONLY MEMORY; U.S. Pat. No. 3,676,864 for OPTICAL MEMORY APPARATUS; U.S. Pat. No. 3,899,778 for MEANS EMPLOYING A MULTIPLE LENS ARRAY FOR READING FROM A HIGH DENSITY OPTICAL STORAGE; U.S. Pat. No. 3,765,749 for OPTICAL MEMORY STORAGE AND RETRIEVAL SYSTEM; and U.S. Pat. No. 4,663,738 for HIGH DENSITY BLOCK ORIENTED SOLID STATE OPTICAL MEMORIES. While some of these systems attempt to meet the above mentioned objectives of the present invention, they fall short in one or more respects.

For example, some of the systems proposed above have lens or other optical structure not capable of providing the requisite resolution to retrieve useful data density. The optical resolution of the data image by these prior lens systems does not result in sufficient data density and data rate to compete with other forms of memory. Although certain lens systems used in other fields such as microscope objectives are theoretically capable of the needed resolutions, such lens combinations are totally unsuited for reading data stored in closely spaced data fields. Another difficulty encountered with existing designs is the practical effect of temperature and other physical disturbances of the mechanical relationship between the data film or layer, the lens assemblies and the optical sensors that convert the optical data to electrical signals. For example, the thermal expansion effects of even moderate density optical memories of this type can cause severe misregistration between the optical data image and the read out sensors. Similar difficulties are encountered in the required registration between the recording process and the subsequent reading operations. Intervening misregistration of the high density optical components can cause significant data errors if not total loss of data.

Accordingly, it is an object of this invention to provide an optical mass memory having random accessibility in a relatively compact size comparable to or even smaller than tape and compact disc storage mechanisms and yet still serving data processing equipment in the same manner that solid state random access memories move data into and from the processor's data bus.

SUMMARY OF THE INVENTION

Data is stored in an optical data layer capable of selectively altering light such as by changeable or storable transmissivity, absorption, reflectivity, polarization, and/or phase. In the case of a transmissive data layer, data bits are stored as relatively transparent spots on a thin layer of material such as photographic film and are illuminated by controllable light sources. An array of imaging lenslets project an optically enlarged image of the illuminated data onto a fixed array of light sensors. The layer of data is organized into a plurality of regions or patches (called pages) and, by selective illumination of each data page, one of the lenslets will image the selected data page onto the array of sensors. Transmitted page data, in this case light passed through the transparent bit locations on the data layer, strike different ones of the arrayed light sensors, thereby outputting a pattern of binary bits in the form of electrical data signals. By selectively and sequentially illuminating different ones of the data regions (pages) on the data layer, correspondingly different data patterns are imaged by the corresponding lenslets onto the same photosensor array, thereby enabling many data pages to be multiplexed at electro-optical speed onto the common photosensor array image plane.

Embodiments of data storage and retrieval systems related to the present invention are disclosed in the above-referenced copending application Ser. No. 07/815,924 as read-only devices, write-only devices, and read/write devices. In accordance with the preferred embodiment of the present invention, each data location on the record, i.e., each data spot has three or more states and thus holds more than a single bit of information. The additional information, in the preferred embodiment, is in the form of modulation of the light energy that reaches the sensor, such as by varied transmissivity, absorption, reflectivity, or polarization.

The recording medium in the preferred form as disclosed herein has a variable optical density, i.e., a variable amount of absorption of light passing through. Silver halide is one simple example of such a medium. When it is properly exposed and developed, it will have a range of "blackness". The range can be considered an analog value, or the range may be divided into several discrete steps or states in density to give a digital value (where digital is tertiary or larger multiples, not just binary).

An alternative is to record each data spot with a varied diameter. The amount of light energy that reaches the sensor will depend on the area size of the spot. In addition, the energy will be modulated by the extent of diffraction by the relatively small spot compared to the wavelength of the illumination. That is, when a data spot aperture becomes comparable to the wavelength, transmitted light will spread out. In the limit of a very small hole, the transmitted light will behave as though the hole is an isotropic point source. This diffraction causes a reduction in the bit energy reaching the sensor simply because the edges of the light bundle are not caught by the first element of the lens system.

Another alternative is to record each data spot as a variable angle polarizer. In this case, the data source may be polarized and the polarizer at individual spots would vary between zero and 90 degrees relative to the source. A variation is to use an unpolarized source but place a general polarizer between the record and the sensor.

These and other features, objects, and advantages of the invention will become apparent to those skilled in the art from the following detailed description and appended drawings.

BRIEF DESCRIPTION OF THE DRAWINGS

FIG. 2 is a plan view showing schematically the layout of individually switchable light sources for illuminating during reading the data region pages, each page containing the multiple state data spots.

FIG. 3a is a plan view similar to FIG. 2 showing the layout of a data layer in accordance with the preferred form of the invention and an associated FIG. 3b is a greatly enlarged view of one of the hexagonal data regions for pages of the data layer illustrating schematically the orthogonal array of rows and columns of data spots in which the actual number of data spots may be greatly in excess of the density schematically shown in FIG. 3b.

FIG. 4 is a plan view similar to FIGS. 2 and 3a showing the array of one of the lenslet system elements, in this instance a refractive element in which the array of such refractive elements is in a hexagonal cell pattern that complements the hexagonal data layer pattern shown in FIG. 3a.

FIG. 5a is a plan view similar to FIG. 4 of another of the lenslets elements, in this case being diffractive elements, and FIG. 5b is an enlarged view taken from one area of FIG. 5a and shows the overlapping circular gratings or holographs of the diffractive elements making up this surface of the lenslet array.

FIG. 8 is a greatly enlarged fragmentary view again of a data layer similar to FIGS. 6 and 7 but showing the individual data spots in the data field as variably polarized.

FIGS. 9a and 9b are electronic block diagrams of the readout control electronics associated with the optical memory of FIGS. 1 through 6.

FIGS. 9d, 9e and 9f are schematic diagrams depicting the topology of a multi-bucket (or multi-well) charge coupled device array that is incorporated into the data image sensor array of the optical memory of FIG. 1 and which also appears schematically in the FIG. 9a block diagram of the control electronics.

FIG. 9g is a timing diagram showing the sequence of signal operations associated with the multi-bucket charge coupled solid state sensor of FIGS. 9a and 9d through 9e.

DETAILED DESCRIPTION

Figure 1:
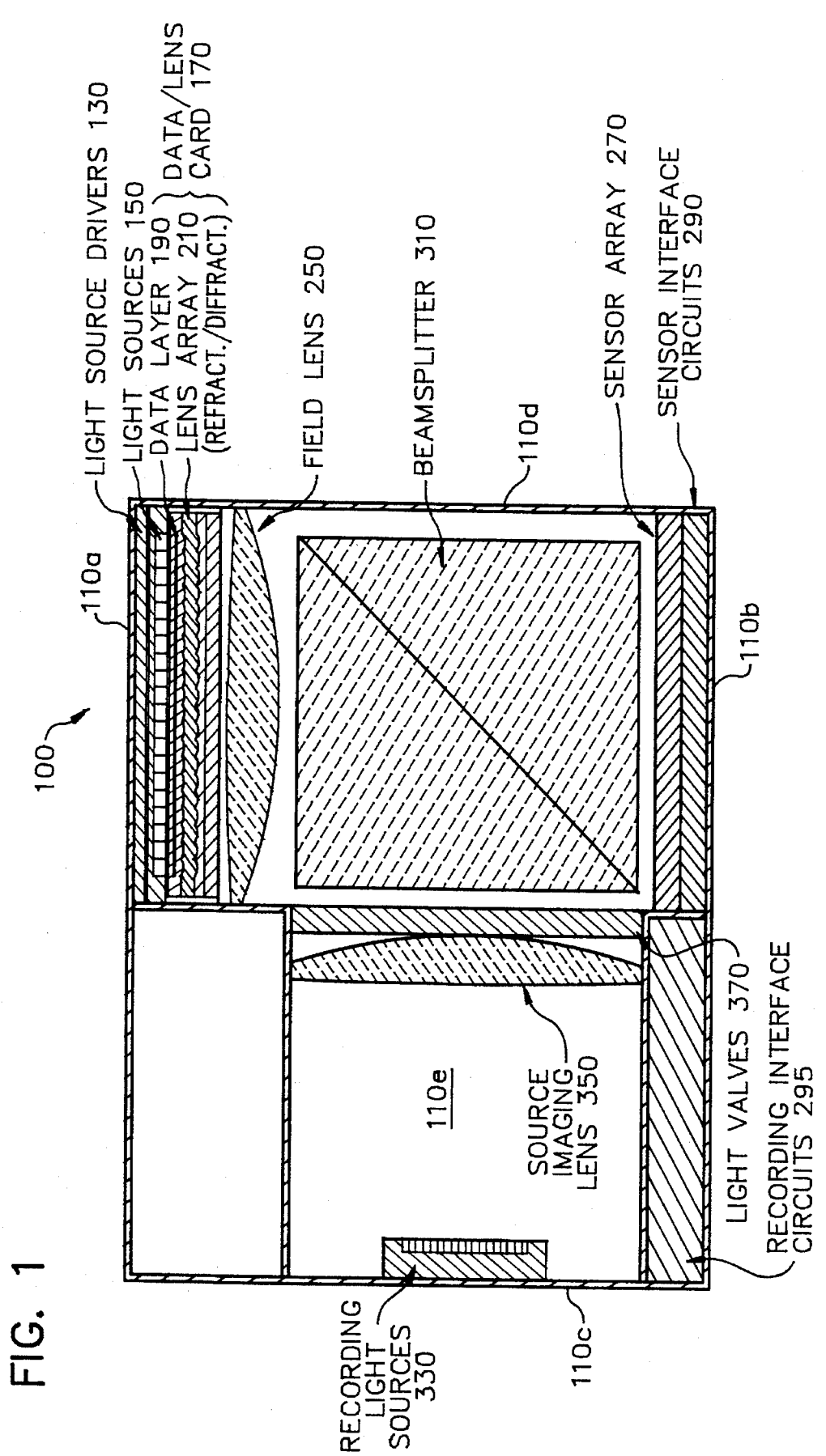
FIG. 1 is a section view in elevation of an optical memory having multiple state data spots for extended storage capacity in accordance with the preferred embodiment.

With reference to FIG. 1, an optical random access memory 100 incorporating a preferred embodiment of the multiple state data spots in accordance with the invention is shown to include a housing 110 of a regular polygon shape, in this instance including top and bottom walls 110a and 110b, respectively; opposing side walls 110c and 110d, and a front wall 110f (cut away) and back wall 110e as disclosed in related copending U.S. application Ser. No. 07/815,924 and international Application Serial No. PCT/US92/11356, the published specifications of which are incorporated herein by reference. Although not critical to the present invention, housing 110 is substantially bisected into left and right chambers each of a generally cubical shape in which the right hand chamber contains the electronics and optical components for reading data by projecting an image of each selected region or page of data spots onto a photosensor array disposed adjacent the bottom wall 110b at the right hand side of the housing. The left hand chamber of housing 110 contains the electronics, light sources, and other optics that function to compose, project and record data images onto a blank data film or a recordable data layer positioned in the right hand chamber as described more fully below.

READ COMPONENTS

To more easily understand the construction and operation of the combined write/read system shown in FIG. 1, only those elements of the system used for reading data will be described first, then the write (or record) elements will be introduced and explained. Thus, with reference to the right hand side of the bisected house 110, there is provided adjacent the upper housing wall 110a, an array of light source drivers 130 formed in an integrated circuit and coupled by micro leads (not shown) to an array of solid state photoemitter elements serving as the read light sources 150. Light sources 150 are mounted on a circuit board or other integrated structural unit to fix the sources in a closely packed dense light pattern. Immediately beneath and parallel to light sources 150, a unitary data/lens card structure 170 is removably mounted for storing on a data layer 190 having multiple state information spots organized in an array of data pages or regions. A complementary lenslet array 210 is bonded to data layer 190 and has a plurality of lenslets disposed in precise, fixed optical registration with each multi-spot data region or page. Unitary data/lens card structure 170 is fabricated as a bonded unit so that the array 210 of lenslets is fixed in spatial relation to the data layer 190 and so that the structure 170 is readily removable as a unit from housing 110 of the optical memory 100 without disturbing this critical optical spatial relationship.

In the now preferred form of the data/lens card structure 170, the lenslets 210 include one or more refractive and/or diffractive elements 210-1 and 210-2 shown separately in FIGS. 4 and 5a. Following the card structure 170, the rays of data images projected from data layer 190 and lens array 210 as a result of illumination by light sources 150 are further redirected by field lens 250 having an aperture that encompasses the entire depth and width of the right hand chamber of housing 110. Hence, field lens 250 in this embodiment is of generally rectangular shape about its perimeter and otherwise has conventional spherical or plano optical surfaces.

Beneath the field lens 250 there is a cavity that allows for the optical convergence of the data image rays which in turn form the data image onto an upwardly facing common image plane of sensor array 270. An intervening beam splitter 310 functions during recording of data, as described below, but is essentially transparent to the projected read image between field lens 250 and sensor array 270. The data image projected onto array 270 in this preferred embodiment is in the general shape of a hexagon, or roughly circular, conforming to the image generating data pages on layer 190, and the light sources and optics; however, the sensor array 270 itself may have a substantially rectangular or, in this case, square perimeter. Beneath sensor array 270 is located the sensor interface circuitry 290 which is preferably fabricated as an integrated or printed circuit wafer of similar thickness and rectangular perimeter to complement and lie subadjacent sensor array 270 as shown.

Thus, in operation, a single page of data selected on data layer 190 by energizing a chosen cell of light sources 150, causes a data image to be generated that has roughly the shape of a hexagon and fills the image plane on the upper surface of sensor array 270.

The individual data spots within a single data page are here arranged as shown in FIGS. 3a and 3b in close packed fields and at densities that use to advantage high resolution optical films and other record media including but not limited to photochemical films. To provide storage competitive with other types of memory, the data spots must be in a size range of 2.25 to 0.5 microns and a center-to-center spacing also in that range. Moreover, in accordance with the present invention, each data spot encodes three or more states and preferably from 4 to 64 states or levels by such processes as variable density, size or polarization, so that more than one binary bit of data is retrieved from each data point or spot. Each data page is then formed by the amount of individual data spots that can be collected and grouped into a single hexagon cell as shown in FIGS. 3a and 3b and at the preferred density range of $2\times10^7$–$4\times10^8$ spots per cm$^2$ it has been found that about $1\times10^6$ spots of data per page (or region) is an advantageous quantity that results in the generation of a data image after magnification that can be reliably sensed by photosensitive elements of sensor array 270. In this case, the preferred embodiment provides an optical magnification through the various lens assemblies of approximately 20 to 30 times. Thus, assuming a magnification of 25, the spacing of the projected image elements on sensor array 270 is on the order of 25 microns and a hexagon cell consisting of a page of data will, in this embodiment, contain one million data spots per page that are imaged onto a corresponding number of photosensitive elements in array 270, to yield data of at least 4 times the number of spots or 4,000,000 bits of data per page.

Figure 6:
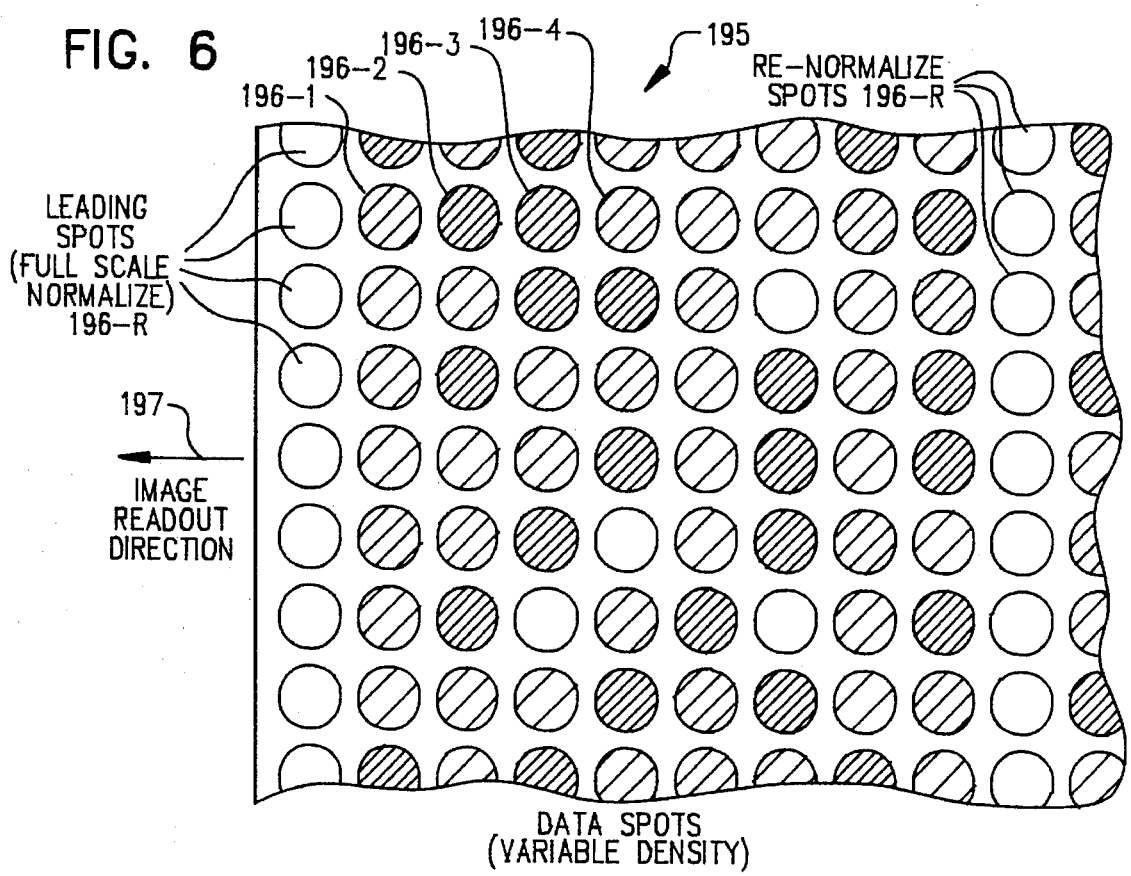
FIG. 6 is a magnified fragment of the data layer illustrating data spots having variable optical (in this case, variable transmissivity) and in which certain of the data spots are reference spots of known density for normalizing the components during readout.

The particular structure and operation of the sensor array 270 and various alternatives to the preferred embodiment are described in greater detail below. For the present, however, it will be appreciated that each data spot causes a photosensitive element of sensor array 270 to detect the multiple states, or levels of photo signals. Although different forms of data layer 190 may be employed, in the present preferred embodiment data layer 190 is a variable density transmissive mask or film (a fragment of which is shown in FIG. 6).

It will thus be seen that the read elements and operation of optical memory 100 provide for accessing each of hundreds of pages of data having, for example, a minimum of 4,000,000 bits per page at 1 micron spot size. The read out of data from sensor array 270 is described in greater detail in connection with FIGS. 9a, 9b and 9c, but briefly it is seen that by selecting a single data page on data layer 190 by energizing one cell of the light sources 150 an entire page of $4\times10^6$ bits is made available at the output interface circuitry 290 associated with sensor array 270 at speeds typical of electro-optical switching, e.g., equal to or less than 100 nanoseconds. Data words that make up different portions of the entire page may be addressed, such as a column or row of data on each page, or the entire page may be output. Each row or column of data within an accessed page may contain as many as 4,000 data bits, hence making fast retrieval of exceedingly long bit words of this magnitude within the capability of the optical memory 100. In terms of dimensions, a 1,000,000 ($10^6$) spot page imaged on sensor array 270 will occupy a hexagon that would fill an area of 6.5 cm$^2$ or about 1 square inch. Similarly, at the above stated preferred density range of $2\times10^7$–$4\times10^8$ spots per cm$^2$, an area of 6.5 cm$^2$ (about 1 square inch) contains as many as 640 patches or pages of data. In effect, the multiple pages of data bits are multiplexed onto the image plane at sensor array 270 by electronic switching of read light sources 150.

In the preferred embodiment, each page 195 of data layer 190 contains the above specified number of data spots, such as $10^6$ spots per page at a density of about 1 micron spacing. Each spot 196 other than reference or fiducial spots that are discussed later, have a variable density that is depicted in FIG. 6 by a fragment of page 195 illustrating the levels of different density by the cross-hatched circular data spots 196-1, 196-2, 196-3–196-n.

The varied level or density of each data spot 196-1 through 196-n is recorded by grey scale recording techniques discussed more fully below, or by photographic copying processes using photochemical development. Thus, for example each of data spots 196-1 through 196-n stores multiple levels or states, for example 4 to 64 individual states or levels, in order to represent 2 to 6 binary bits of data. A four level density or transmissivity with adequate dead bands between levels would thus represent two states raised to the power of two, or four two-bit binary values of 00, 01, 10 and 11. Data spots having 8 separate levels of transmissivity would thus store 3 bits or two raised to the power of three binary values of 000, 001, 010, 100, 011, 111, 101 and 110. It is thus seen that the amount of data stored and retrievable from data layer 190 is multiplied and enhanced greatly by the number of data levels or density levels that can be stored at each spot. In order to faithfully retrieve this data, the sensor and associated electronics must be able to differentiate effectively between the density levels, in this case transmissivity levels, of each data spot. An analysis of the detection processes as well as the uniformity of the data layer material and the varied density at each spot shows that each sensor element on array 270 must be able to measure the amount or level of data spot light energy to an accuracy of one part in $2^{nth}$ with a confidence of one part in 18, where n is equal to the number of bits to be represented by a single spot. Put in another way, the signal to rms noise of an ordinary single bit two-state system of maximum and minimum transmissivity, should be at least 25 db or roughly 18:1 s/n ratio. For a multi-state or level spot system as in accordance with the present invention, the overall s/n ratio must be $2^{nth} \times 18:1$. Thus for a system that stores at each spot a six bit value or $2^6=64$ levels, the overall s/n ratio must $64 \times 18:1$ or 1152. While the individual dynamic range of available solid state sensors of the charge couple device (CCD) type is on the order of 2000:1, the variation in sensitivity between sensor element to sensor element is typically on the order of 5%. This inter-sensor effect is called photo response non-uniformity or PRNU. This means that the noise attributed to the sensitivity variation from sensor to sensor creates a noise constraint that limits the range of the sensors to about a ratio 20:1. While this may be suitable for some applications in which the number of states to be stored and retrieved from each data spot is relatively small, not more than 3 states, a preferred embodiment of the invention provides for calibrating and normalizing the data layer to sensor readout of the data image to yield an expanded practical dynamic range of the data layer to sensor operation and moreover greatly enhance the repeatability and reliability of the optical memory. While one alternative technique in accordance with the present invention would be to calibrate and trim out the individual sensor elements of array 270 to minimize the sensor to sensor differences in sensitivity, a preferred way is to configure the data layer and the electronics associated with the readout of the sensor array in such a manner that the sensor elements and the multiple state spots are both calibrated to a known level and then normalized from sensor element to sensor element to achieve the needed signal to noise ratio for reliable data storage and retrieval.

Thus in the presently preferred embodiment, calibration of the sensor array is achieved in part by selecting one or more pages in the data layer as a reference page that is recorded with all 1s or maximum transmissivity at each of the data spots within that page. In the embodiment disclosed, data layer 190 in FIG. 3a is shown to have a centrally located page 195-rp as a reference page of all "1s". Prior to reading data from the other pages of the overall data layer or chapter of pages, the reference page 195-rp is illuminated by its associated one of light sensors 155 causing the image of all "1s" to activate the sensor array 270. Assuming perfect components, all of the sensor elements of array 270 would thus be illuminated or energized to maximum response, thereby establishing a reference or base level of sensor element sensitivity. The sensor output for each reference "1" is stored in a reference bucket provided as an auxiliary storage bucket or location in the CCD array as shown and described in connection with FIGS. 9d through 9f. Thereafter the variable level data is read out from a page 195 of chapter data layer 190 and the resulting charge or signal level shifted into a data signal bucket underlying the sensor elements and being available along with the reference value in the reference bucket for readout. From the storage buckets of the CCD array, the reference value and the data value are outputted into electronics that normalize the sensor to sensor variations and produce a grey scale or variable level signal which is then analogue to digital (A/D) converted to yield the extended amount of data available on each page.

Figure 9A:
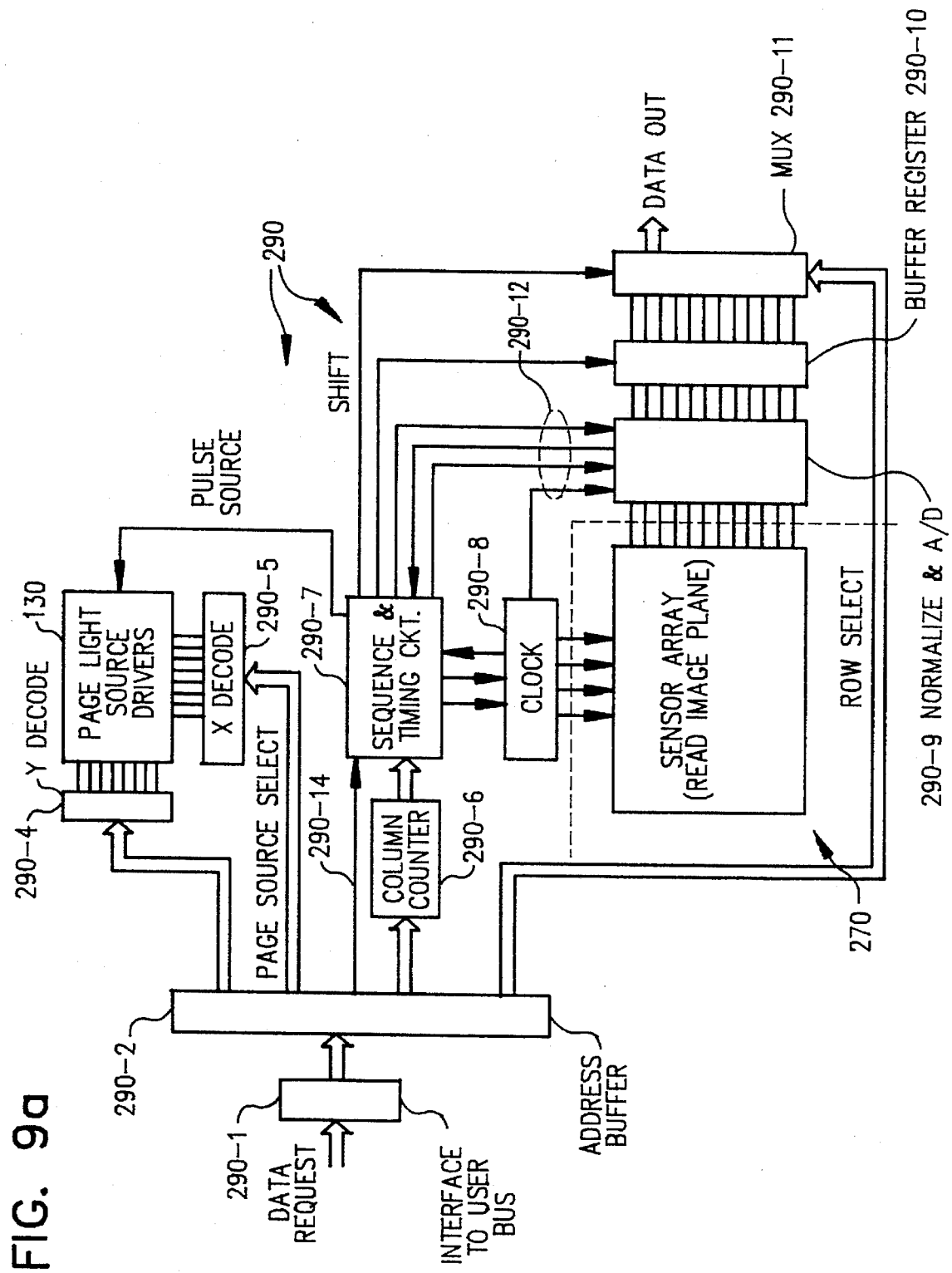

Thus with reference to FIG. 9a, sensor array 270 is associated with readout control electronics 290 to enable detection of the multiple states or levels of the sensed image resulting from the variable transmissivity or grey scale spots 196-1, 196-2 - 196-n of page 195 as shown in FIG. 6. A data request including page address and sub-page addressing, if required, is applied through an interface 290-1 that in turn is communicated over a user bus to address buffer 290-2 of the interface electronics 290. The address data in buffer 290-2 supplies x and y decode addresses that select a data page and cause page or light source drivers 130 to energize the selected page light source. Initially during page readout, the light source driver corresponding to the reference page 195-RP (FIG. 3a) is selected and through the sequence of operations described below, the reference "1s" for the entire page are imaged onto sensor array 270 thereby causing reference values for each of the sensors of the array to be stored in one of the charge coupled device buckets.

In addition to the page address, buffer 290-2 is loaded with column and row addresses. The column addresses for each page are monitored in a column counter 290-6 that, in conjunction with a start signal on lead 290-14, controls the phase and operation of sequence and timing circuit 290-7 that in turn provides the proper sequence and phase of timing signals to page light source drivers 130 and to output devices that include normalize and A/D converter 290-9, buffer register 290-10 and multiplexer 290-11. A clock 290-8 receives control signals from sequence and timing circuit 290-7 and produces a needed complement of variously phased clock signals to sensor array 270 for shifting signals into and out of charge couple storage buckets that underlie the sensor elements as explained more fully in connection with FIGS. 9d through 9g.

FIG. 9b shows the preferred construction of normalize and A/D converter 290-9 and its connection to the rows of charge coupled device sensor array 270. In this instance for simplicity and clarity, an extension of a single row n is shown as element 270' in FIG. 9b. The divisions of the extension of row n of the fragment 270' of the array are used to illustrate the organization and separation of the reference signal in the form of a reference charge and a data level signal in the form of a data charge as these charges are shifted from the multiple storage buckets underlying sensor array 270 into normalize and A/D converter 290-9. For each row of sensed data in sensor array 270, a reference (value) charge and multi-state or level data (value) or charge are outputted into the normalization portion of the circuit shown in FIG. 9b including a reference amplifier 290-9-1 and a corresponding data amplifier 290-9-2 which couples the reference and data charge signals into a pair of clocked sample and hold circuits 290-9-3 and 290-9-4. These sample and hold circuits, when sequenced by clock 290-8 over a first of a group of timing leads 290-12, hold the reference and data charge signal for processing by the normalizing circuit including a fixed amplifier 290-9-6 and a variable amplifier 290-9-7, another sample and hold circuit 290-9-8 and a differential amplifier 290-9-10. The outputs of fixed and variable amplifiers 290-9-6 and 290-9-7 are applied as the inputs to differential amplifier 290-9-10 and are also applied as the reference and variable analog signal to A/D converter 290-9-12. Sequence signals from sequence and timing circuit 290-7 control the timing of operations of the normalize and A/D converter circuit 290-9 in accordance with the phase and timing diagram of FIG. 9c discussed below. In essence, the reference and charge values cause a difference value to be stored in sample and hold 290-9-8 and when a normalize sources control signal is applied, this value is held for adjusting variable amplifier 290-9-7 to normalize the sources to the reference levels sampled when the center reference pages are flashed and re-normalize the values whenever the periodic full scale normalization data spot shows up in the page of data during readout as mentioned above in connection with FIG. 6 as the leading spots for normalizing 196-R and the renormalizing spots 196-R placed in this instance at every eighth spot position in the field of data within each data page. A leading detect circuit 290-9-14 provides a detection of the first set of spots within the data field that represent reference levels and correspond to the first or leading spots 196-R in the left hand column of the data page 195 shown in FIG. 6. This leading edge signal is fed back to sequence and timing circuit 290-7 to mark the start of a data readout sequence as described below in connection with FIG. 9c. A/D converter 290-9-12 receives a convert timing signal over one of leads 290-12 as indicated from circuit 290-7 to effect the A/D conversion that is represented by the inputs to circuit 290-9-12 from the outputs of amplifiers 290-9-6 and 290-9-7. The reference signal to the A/D establishes the reference current within the usual comparison ladder of the A/D. The conversion of the data signal takes place as a fraction of the reference, rather than as a fraction of a fixed voltage or current level.

Thus with the data readout direction indicated by arrow 197 in FIG. 6, a leading edge of an array of data spots are for quantifying and normalizing the sensor electronics and for this purpose these leading spots 196-R are recorded with the greatest level of transmissivity which may be represented by the value "1". In the direction of readout 197 there is also an additional set of quantifying and normalizing reference spots 196-R for re-normalizing the sensor readout as the data is retrieved from the array of spots along the page.

Figure 9C:
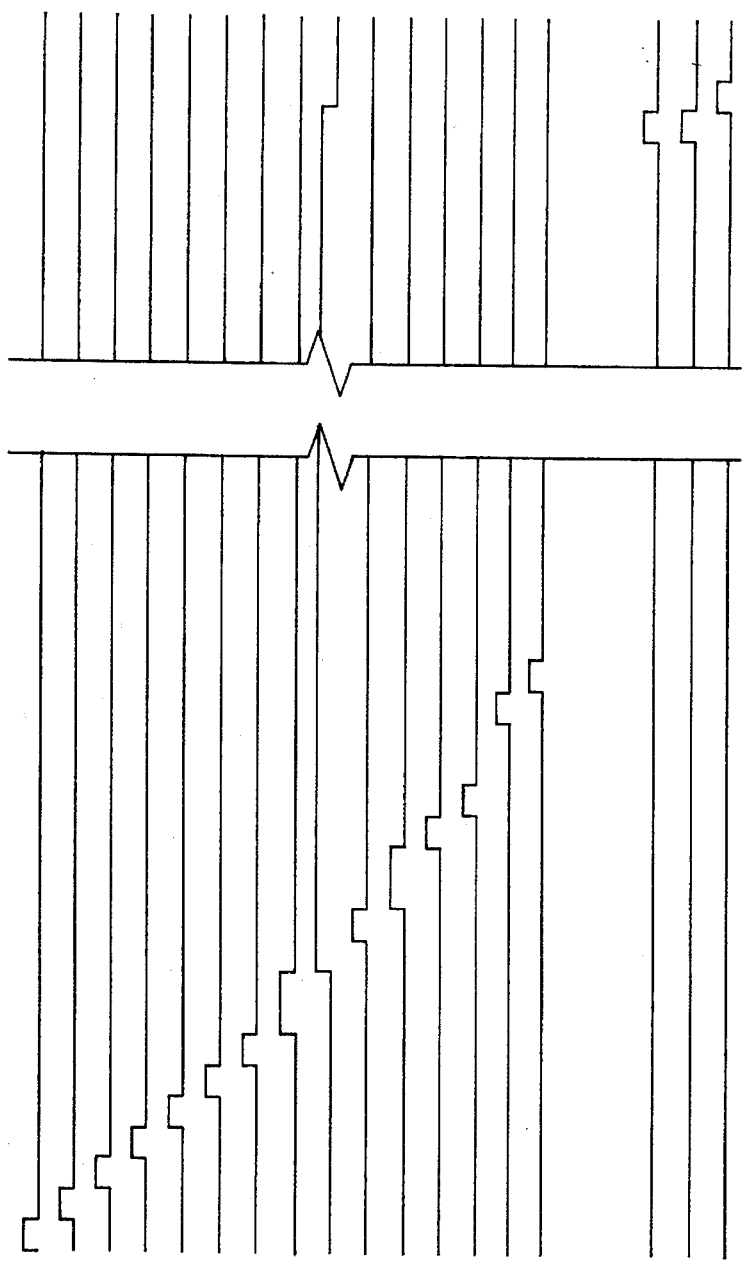
FIG. 9c is a timing diagram showing the sequence of signals and operations associated with the control electronics shown in the block diagrams of FIGS. 9a and 9b.

With reference to FIG. 9c, the sequence of operations of the circuits of FIGS. 9a and 9b is shown to commence with a data request timing signal that in turn initiates an address reference page source signal followed by a signal for pulsing the reference page source, that is reference page 195-rp shown in FIG. 3a that contains the full scale or all "1s". When the reference page is flashed by pulsing its light source, the resulting reference image on sensor 270 is stored by a timing signal that shifts reference charge into a reference bucket channel of the CCD network underlying the sensor elements of array 270. The system has now stored the needed reference level for all of the individual sensor elements of array 270. At this time, and as shown in FIG. 9c, the input data request causes the appropriate data page to be addressed as indicated by a signal address data page source which in turn causes a signal to pulse the data page source. The multiple data levels or states from the data page spots cause the sensor elements to be energized to different levels. The sensed signal level is in turn temporarily stored and shifted out of the sensor element of the array into a data output channel. Now a signal is applied to the sensor array 270 for addressing the charge coupled device row and word, which in turn starts the charge coupled device clock 290-8. The resulting operation of clock 290-8 is described more fully below in connection with FIGS. 9d through 9g and relates to the manner in which the sensed spot signal levels, both reference and data, are shifted from charge storage wells or buckets out of the array and into the input amplifiers of normalize and A/D conversion circuit 290-9. The next timing signal in FIG. 9c is the feedback signal from the leading detect circuit 290-9-14 (FIG. 9b) that reflects the presence of a full scale normalizing value in a first position of the row of image data to be outputted and which initiates a normalization sequence indicated by the signal entitled "Normalize Sources" (S/H A) referring to the operation of sample and hold circuit 290-9-8 of FIG. 9b and the setting of the gain of amplifier 2990-9-7 that cause normalization of the individual reference spots interspersed on a data page with the earlier stored values from reference page 195-rp. The timing and sequence continues with the reading of the next spot, which will be a data spot corresponding, for example, to data spot 296-1 of the row of data spots 296-1, 2, 3, 4–n. The ensuing timing signal operates the A/D conversion as a convert pulse input to circuit 290-9-12 (FIG. 9b) which is followed by signals causing the output of the A/D conversion to be stored in buffer register 290-10. Thereafter the sequence continues to read data spots including the renormalization reference spots in this instance at every tenth location in a row until the end of a data row marked by a timing signal referred to as end of row (S), at which time a stop clock signal is produced and after a delay, a timing signal issues indicating that all data are now available at buffer register 290-10 and multiplexer 290-11.

It should be understood that the sequence of reference source flash and data source flash may be interchanged. The only resulting change would be that the inputs to the amplifiers 290-9-1 and 290-9-2 would be interchanged.

Now, with reference to FIGS. 9d–9g, to reduce contributions of photo response non-uniformity (PRNU), a sensor architecture is advanced which allows in each data spot for the dual use of the photo element. A reference pattern may be imposed on the sensor and the resulting charge stored in an interline transfer register, then the signal of interest is sampled and the two results (stored in separate parts of the output register) are clocked out sequentially.

The charge coupled device structure is shown in FIGS. 9d and 9e. FIG. 9e shows the placement of the polysilicon layers. The Poly 100 electrode is driven high to create a depletion region for the integration of photo charge. The charge accumulated under this electrode is passed to a well or bucket under phase 42 in the transfer channel by pulsing this phase high, as the integrating electrode (Poly 100) is forced low. The charge is then moved to the electrode under phase $\phi 4$ by pulsing phase $\phi 3$ high as $\phi 2$ goes low and then phase $\phi 4$ high as $\phi 3$ goes low (all with the Poly 100 electrode low). A subsequent illumination of the sensor can place a second sample of charge under the phase $\phi 2$ electrode. These two samples from the same photo diode accomplish a means by which a reference pattern can be used to correct for PRNU in the data image. Polysilicon layers 200 and 300 make up the two clock phases used to actuate the output transfer register. The Poly 100 layer is closest to the substrate surface so it has sole control of the surface potential underneath it.

FIG. 9e shows the under layers. For the preferred embodiment, a surface channel device is used. Alternatively, a buried channel structure can be employed. There is a stopping implant 305 on both sides of the interline transfer channel 315 for lateral charge containment. The exception to this is under phase 42, where there is no implant interdicting flow of charge from the photo sensitive portion of the data spots. This implant 305 is of the same sense as the substrate but of a higher concentration, such as a P+ type, for a device which uses electrons as signal. To force directionality on the charge transfer, with the minimum number of clock phases, a barrier implant is also included. This is also the same sense doping as the substrate (P type), and somewhat higher in concentration (though not as high as the channel stopping region). The existence of this implant forces the channel potential in this region to be lower than in the area without it, thus charge will move along in the direction away from the barrier implant as the electrode voltage is reduced. FIG. 9f shows the layout of these CCD devices in a sensor array. FIG. 9e illustrates the timing of the signals used to shift out the CCD reference and data signals.

Figure 10:
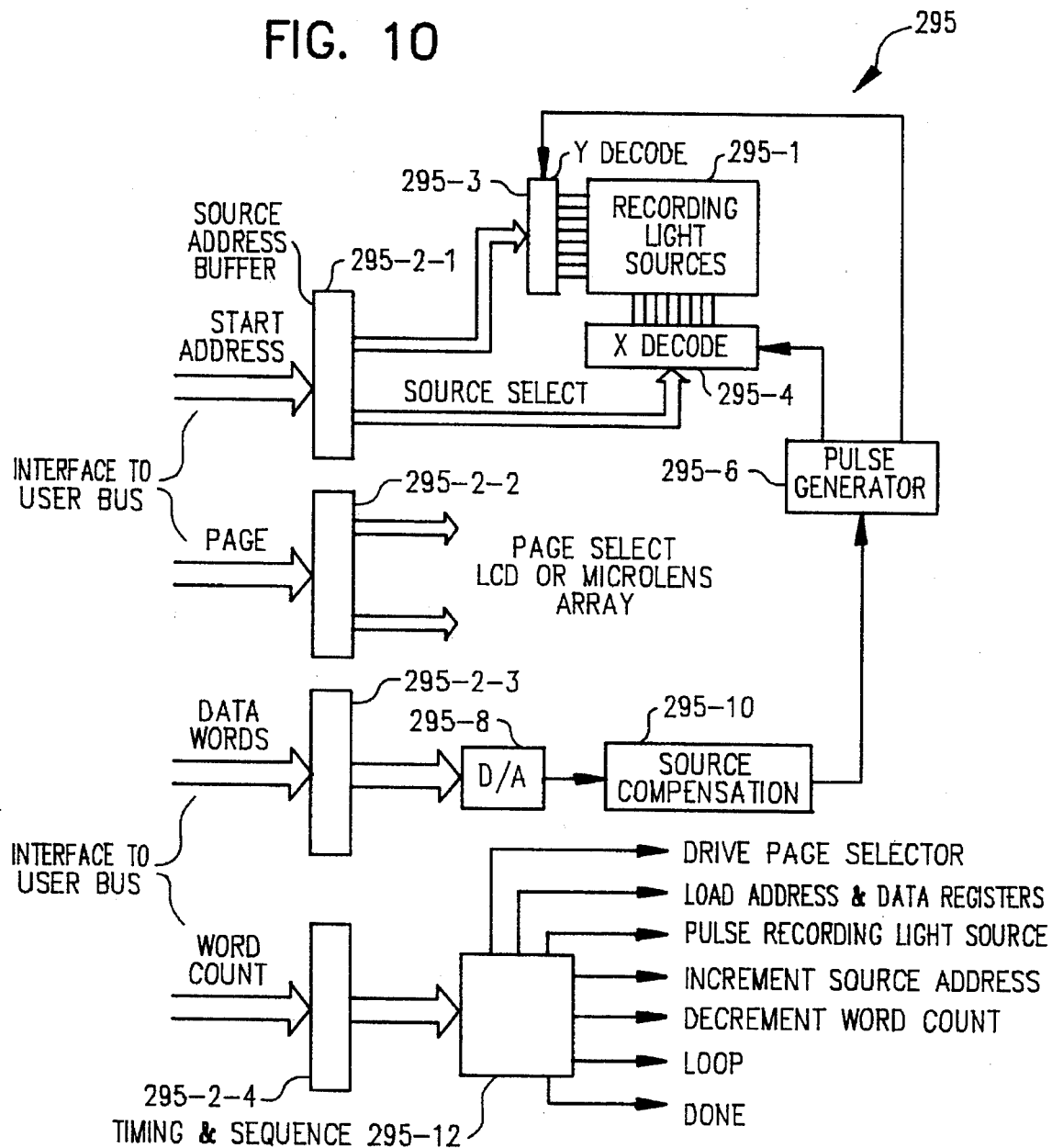
FIG. 10 is a schematic diagram of the recording control electronics for recording the data spots as multiple levels or states, such as density, area (size) and polarization.

FIG. 10 shows a preferred configuration for the recording electronics. To record data onto the patches or pages 195 (FIGS. 3a and 3b), a recording process similar to that disclosed in the above-mentioned copending applications Ser. No. 07/815,924 and PCT/US92/11356, is employed using the page composer consisting of recording light sources 330, imaging lens 350, light valves 370 and recording interface circuits 295 as shown in the left hand chamber of FIG. 1 for forming and directing the recording image light onto the data layer 190 via beam splitter 310. The general functions and operation of these recording elements are disclosed by reference to the drawings and written specification, incorporated herein by reference, of the above-mentioned related copending patent applications. Briefly, the page to be recorded is selected by addressing a specific recording light source 330. The light from that source is imaged onto the selected patch by lens 350, modulated by light valves 370. One spot at a time is recorded by opening a corresponding valve and energizing the selected source at the required energy level.

For this purpose, the recording interface circuits 295 are constructed as shown in FIG. 10 to include a user interface buffer 295-2 for supplying address information, including a page address, for selecting a source driver through buffers 295-2-1, 295-3 and 295-4. The spot location within a page is selected by an address on 295-2-2, which is decoded by x and y axis decoders 295-11 and 295-12 to select a specific valve in 295-13. Several spots are recorded in sequence, so this address is for the first starting spot. Data words loaded into buffer 295-2-3 co-function with the start address in buffer 295-2-2 to cause the light sources to be driven at certain multiple states or levels through a D/A converter 295-8 and source compensator 295-10 controlling a recording light pulse generator 295-6 as indicated. The energy levels which the light sources are driven at determines the degree of transparency (hence transmissivity) recorded (FIG. 6) of each data spot. In such case, the density is a function of the chemical reactions that are mediated by direct photon-electron excitation processes. Another such material would be photon bleached dye, preferably in a plastic binder. Alternatively, the energy of the recording light sources may burn different size holes in the data layer record (FIG. 7) as described below. A word count buffer 295-2-4 governs a timing and sequence generator 295-12 that successively produces signals as indicated for selecting the next valve address, loading data registers, pulsing recording light source, incrementing valve address, decrementing word count, looping through each successive recording sequence and producing a done signal when finished.

When a record having variable hole size is to be recorded (see FIG. 7), a data record having a medium with a sharp energy threshold is used. Since the recording spot cross section is cone-shaped (close to gaussian), the resulting hole size burned into the record depends on the light energy supplied, intensity and duration. To record the variable polarization spots in the record shown in FIG. 8, a material such as a stressed liquid crystal may be used with variable polarizability between zero and 90 degrees, responsive to the selected energy level in the page composer.

The record material could also respond to thermal energy, as delivered by an optical beam. Variable diameter data or spot holes can be recorded with thermal processes as well as high gamma photochemical systems. In the thermal case, photons are still the source of energy just by gross absorption processes. The materials such as dye-polymer, thin metal film, amorphous/crystalline phase change mixtures (e.g., chalcogenide glass), or magneto-optic are suitable. The problem is that these materials are binary. The temperature is proportional to the write energy supplied, but when the temperature rises to the action point, i.e., the melting point, a different mechanism makes the actual change. It is surface tension in the case of dye-polymer or metal films, phase growth for the phase change materials, or a domain flip by an external field for magneto-optic. This secondary effect is not controllable in the same sense as the photochemicals. The only effect that is controllable is location of the transition point, that is, the edge of the hole (or spot), thus making thermal responsive records suitable for variable hole size data, as is the example shown in FIG. 7.

Figure 11A:
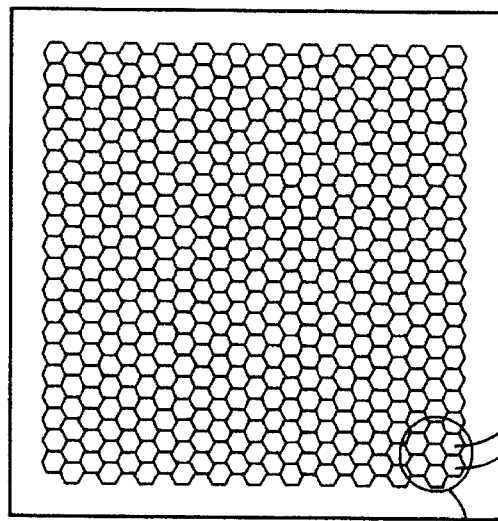
FIG. 11a and the enlarged fragmentary view in FIG. 11b are schematic diagrams of an alternative embodiment of the individually energizable light sources for use in the optical memory of FIG. 1.
Figure 11B:
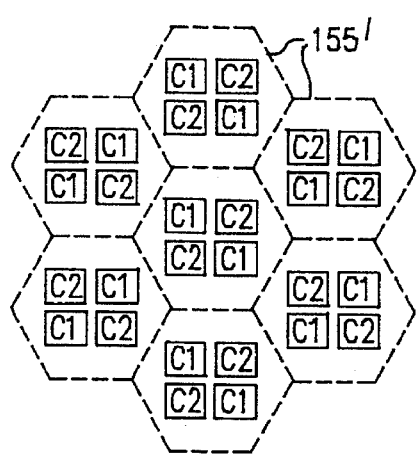
Figure 12:
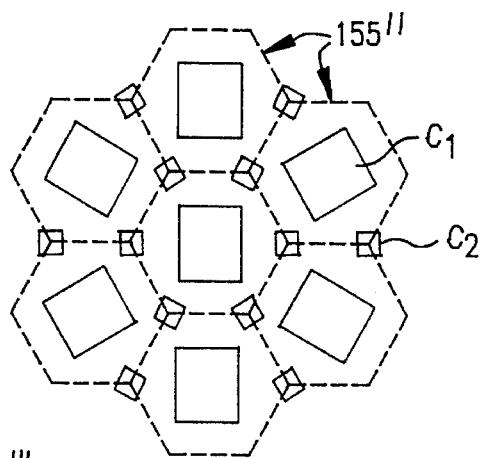
FIG. 12 is an enlarged fragmentary view similar to FIG. 11b showing a further alternative embodiment of the individually energizable light sources.

FIGS. 11a, 11b and FIG. 12 show an alternative configuration of the light sources for implementing a different quantitization and normalization process. As an alternative to the technique for quantitizing and normalizing the sensor cells by flashing a reference page of solid "1s" is to flood the sensor array prior to data readout with a uniform light. For this purpose, the sources shown in FIG. 11a, and in greater detail in the enlargement in FIG. 11b, have two color or wavelength light sources within each page or patch cell. One of the colors, e.g., $C1=\lambda 1$, is selected for optimum resolution and imaging by the particular lenslet and field lens optics and is energized to readout the individual data spots. This is called the "good" color light. Each source cell also includes "bad" color, in this case represented by the color $C2=\lambda 2$, and these source devices are flashed at the beginning of a data read sequence to flood the sensor with illumination of uniform light that enables the quantitization and normalization circuitry described above to minimize sensor to sensor variations in photo sensitivity. Color C2, the "bad" color, is sufficiently different from the lens design color C1 that an image is not formed. Thus the "bad" color is pulsed using the light source cells C2 (FIG. 11b) and the corresponding sensed level at the sensor array is shifted into holding wells or buckets as described above in connection with the pulsed center reference page of all "1s". After the "bad" color C2 sources are pulsed, the data is read out by energizing the "good" light source by flashing the elements C1 of the source array. Since the correction light, or "bad" light, is coming from the very page from which data is to be read, any geometric biases due to angle or lens efficiency differences are automatically compensated. While there are various alternatives to the placement of the "bad" light sources C2, a preferred approach is shown in FIG. 11b in which the sources C1 and C2 are diagonally distributed within the source cells as indicated, hence four sources are used—two C1s and two C2s—alternated at 90° from each other. Two of these cells, the pair of C1s or the pair of C2s, are flashed at any given time. This tends to even out the effects of the asymmetric arrangement of the sources. It may be desirable in implementing this embodiment to use a diffuser to smooth out spatial noise, especially when LEDs are used for the sources. A holographic, diffractive diffuser is preferred over ground glass diffusers. The holographic element more efficiently directs light rays in a pseudo-random way, rather than scattering and hence causing losses of the source light when a ground glass diffuser is used.

An alternative to the diagonal or 90° distribution of the good and bad light source elements shown in FIG. 11b is to place the good light sources C1 at the center of each of the honeycomb cells as shown in FIG. 12 and make these sources somewhat larger than the "bad" source elements C2 which are distributed on the divisions between source pages as indicated. Thus each light source cell 155" as shown in FIG. 12 is primarily made up of the good source C1. To flash the "bad" light sources, the distribution of sources C2 around each cell are energized at one time for any particular page.

Figure 7:
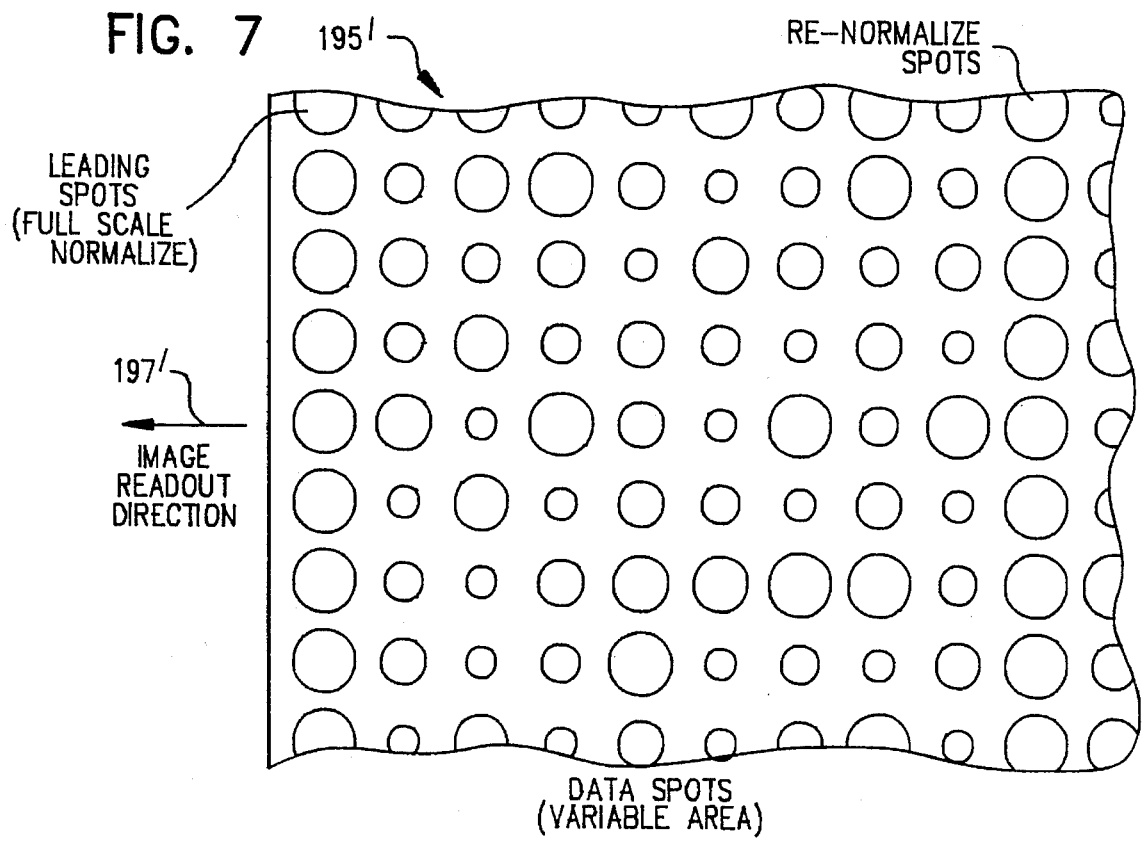
FIG. 7 is a greatly enlarged fragmentary view of a data layer similar to FIG. 6 but in which the field of data spots are of variable area.

As yet another alternative, the opaque character of the medium may be composed of a dye. The data spots have a variable amount of dye to provide the attenuation required by the data to be recorded. The source color selected for data readout, C1, is variably absorbed by the dye, and causes an image of the data to form on the sensor array when C1 sources are flashed as discussed before. The wavelength of the second source color, C2, is close enough to C1 that a good image is formed, but the wavelength is outside of the absorption band of the dye. When the reference source, C2, is flashed there is substantially no absorption and all "1s" are imaged on the sensor, which are subsequently shifted into the reference buckets as before. This alternative has the advantage that normalization is available for each individual data spot as well as the corresponding sensor. Further, the same dye technique can be applied to the variable diameter spots (FIG. 7). In this case, the dye has only two valves, high absorption and no absorption, i.e., a hole. The reference C2 light will pass through all spot locations and again all "1s" will be imaged on the sensor.

Figure 13:
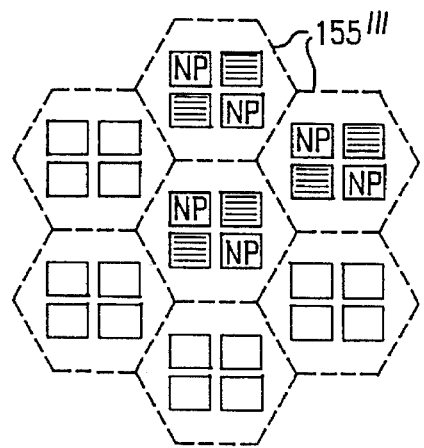
FIG. 13 is an enlarged fragmentary view similar to FIGS. 11b and 12 showing still another alternative embodiment of the energizable light sources.

With reference to FIG. 13, a still further alternative embodiment is shown for implementing the reference light source to quantitize and normalize the sensor array. In FIG. 13, a group of source cells is shown to include a distribution of both polarized and unpolarized sources P and NP subpage sources. A pair of polarized P sources and a pair of unpolarized NP sources may be used as illustrated, arranged similarly to the good and bad light sources of FIG. 11b, at diagonally opposite or 90° rotated positions as depicted. This type of light source would be used preferably with the variably polarized record shown in FIG. 8. Alternatively, the reference source, instead of being non-polarized, could be circularly polarized so as to be transparently passed through the variably polarized data spots for uniform energization of the sensor elements. As in the case of the "good" and "bad" light embodiment shown in FIGS. 11a and 11b, and FIG. 12, the embodiment of FIG. 13 does not require a separate reference page as does the preferred embodiment described herein before. The readout process is the same as described above using the dual well or dual bucket CCD sensor array. This attenuation also has the advantage that each individual data spot and corresponding sensor can be normalized.

While only particular embodiments have been disclosed herein, it will be readily apparent to persons skilled in the art that numerous changes and modifications can be made thereto, including the use of equivalent means, devices, and method steps without departing from the spirit of the invention.

I claim:

1. An optical system comprising:

an optical data means for storing data as light altering characteristics and being organized into a plurality (P) of juxtaposed data regions each having capacity to store (N) data spots, in which at least certain ones of said data spots have a multiplicity of three or more light altering states, and wherein said multiplicity of light altering states are adapted to encode two or more bits of data at each of said certain ones of said data spots;

controllable light source means for selectively illuminating at least one of said data regions of said optical data means;

data imaging lens means having a plurality of juxtaposed lenslets each being formed and arranged in such proximity to and in optical registration with a separate one of said juxtaposed data regions so that the image resolving power thereof is substantially uniform over the field of view of said separate data region to form an image thereof on a common image surface spaced from said data means and lens means;

sensor means having a plurality (S) of juxtaposed light sensor elements arranged at said image surface for sensing data as a light image corresponding to an illuminated data region, said sensor means including light state detection means for detecting at each of said sensor elements said multiplicity of light altering states of said data spots as imaged onto said common image surface; and data signal output means coupled to said sensor means for outputting data signals representing said two or more bits of data of said data spots of an illuminated and imaged data region.

2. The optical data system of claim 1, further comprising sensor element normalization means for sequentially flashing certain ones of said controllable light source means prior to or after the selective illumination of said separate data regions for creating a sensor level reference, and sensor level output adjustor means for adjusting each sensor element signal level output as a function of said sensor level reference.

3. An optical data system comprising:

an optical data means for storing data as light altering characteristics having a density on the order of one data spot per square micron and being organized into a plurality of juxtaposed data regions each adapted to store a field of data spots each of which has 3 or more light altering states for storing more than 1 binary bit of data;

controllable light source means for selectively illuminating at least one of said data regions of said optical data means;

lens means having a plurality of juxtaposed lenslets configured to resolve objects on the order of one micron or less and each arranged proximate and in optical registration with a separate one of said juxtaposed data regions for forming an image of the field of data thereof on a common image surface spaced from said data means and lens means;

sensor means having a plurality of juxtaposed light sensor elements arranged at said image surface for sensing said data as a light image of an illuminated data region, and including means for discriminating between said 3 or more states of each of said data spots; and data signal output means coupled to said sensor means for outputting data signals representing said data of more than 1 binary bit per data spot of an illuminated and imaged data region.

4. An optical data system comprising:

an optical data record means for storing data as light altering characteristics and being organized into a plurality (P) of juxtaposed data regions each having capacity to store (N) data spots, in which at least certain ones of said data spots have a multiplicity of light altering states to store two or more bits of data;

controllable light source means for selectively illuminating at least one of said data regions of said optical data means;

data recording means for photo-optically writing data to each of said (N) data spots to store thereat one of said light altering states;

data imaging lens means having a plurality of juxtaposed lenslets each being formed and arranged in such proximity to and in optical registration with a separate one of said juxtaposed data regions so that the image resolving power thereof is substantially uniform over the field of view of said separate data region to form an image thereof on a common image surface spaced from said data means and lens means;

sensor means having a plurality (S) of juxtaposed light sensor elements arranged at said image surface for sensing data as a light image corresponding to an illuminated data region, said sensor means including light state detection means for detecting at each of said sensor elements said multiplicity of light altering states of said data spots as imaged onto said common image surface; and data signal output means coupled to said sensor means for outputting data signals representing said two or more bits of data of said data spots of an illuminated and imaged data region.

5. The optical data system of claim 4, further comprising sensor element normalization means for sequentially flashing certain ones of said controllable light source means prior to or after the selective illumination of said separate data regions for creating a sensor level reference, and sensor level output adjustor means for adjusting each sensor element signal level output as a function of said sensor level reference.

6. An optical data recording system comprising:

an optical data means for storing data as light altering characteristics having a density on the order of one data spot per square micron and being organized into a plurality of juxtaposed data regions each adapted to store a field of data spots each of which has from 4 to 64 or more light altering states for storing 2 to 6 or more binary bits of data at each spot; and data writing means including controlled writing light source and controlled shutter means for writing said 4 to 64 states to each data spot.

7. The optical data system of claim 4 having sensor element normalization means that comprises:

means for reference flashing said controllable light source means; and means for adjusting output levels of said sensor means in response to said reference flashing of said controllable light source means.

8. The optical data system of claim 7 wherein said sensor element normalization means further comprises timing circuit means for timing said reference flashing said controllable light source means at intervals timed before or after said selectively illuminating at least one of said separate regions.

9. The optical data system of claim 7 wherein said means for adjusting output levels of said sensor means comprises means for storing sensor reference levels in response to said reference flashing of said controllable light source means.

10. The optical data system of claim 8 wherein said sensor element normalization means further comprises multi-bucket charge coupled device array means for storing sensor reference levels in response to said reference flashing of said controllable light source means.

11. The optical data system of claim 1 having sensor element normalization means that comprises:

means for reference flashing said controllable light source means;

means for adjusting output levels of said sensor means in response to said reference flashing of said controllable light source means.

12. The optical data system of claim 11 wherein said sensor element normalization means further comprises timing circuit means for timing said reference flashing of said controllable light source means at intervals timed before or after selectively illuminating at least one of said separate regions.

13. The optical data system of claim 11 wherein said sensor element normalization means further comprises multi-bucket charge coupled device array means for storing sensor reference levels in response to said reference flashing of said controllable light source means.

14. The optical data system of claim 11 wherein said sensor element normalization means comprises reference level storing means for storing sensor response levels in response to said sequentially flashing certain ones of said controllable light sources.

15. The optical data system of claim 2, said sensor means comprises charge coupled array means and said sensor level output adjustor means comprises auxiliary storage wells in said charge coupled array means for storing sensor response reference levels in response to said sequentially flashing certain ones of said controllable light source means.

16. The optical data system of claim 1, further comprising bonding means for bonding said optical data means and said data imaging lens means together as a structural and optical unit, thereby maintaining consistent optical registration therebetween.

17. The optical data system of claim 3, further comprising means for structurally bonding said optical data means to said lens means.

18. The optical recording system of claim 6, further comprising data read means having:

controllable read light source means for selectively illuminating at least one of said data regions of said optical data means;

data imaging lens means having a plurality of juxtaposed lenslets each being formed and arranged in such proximity to and in optical registration with a separate one of said juxtaposed data regions so that the image resolving power thereof is substantially uniform over the field of view of said separate data region to form an image thereof on a common image surface spaced from said data means and lens means;

sensor means having a plurality (S) of juxtaposed light sensor elements arranged at said image surface for sensing data as a light image corresponding to an illuminated data region, said sensor means including light state detection means for detecting at each of said sensor elements said multiplicity of light altering states of said data spots as imaged onto said common image surface; and data signal output means coupled to said sensor means for outputting data signals representing said two to six bits of data of said data spots of an illuminated and imaged data region.

19. The optical data recording system of claim 18, further comprising means for structurally and optically bonding said optical data means to said lens means.

20. The optical recording system of claim 18 wherein said data writing means includes optical means for directing said controlled writing light source through said lens means to write said 4 to 64 states to each said data spot of said optical data means, whereby light for said writing and reading of data pass through said lens means.

* * * * *